(12) United States Patent
Lehmann

(10) Patent No.: US 7,932,587 B2
(45) Date of Patent: Apr. 26, 2011

(54) SINGULATED SEMICONDUCTOR PACKAGE

(75) Inventor: Thomas Lehmann, Sinzing (DE)

(73) Assignee: Infineon Technologies AG, Neubiberg (DE)

( * ) Notice: Subject to any disclaimer, the term of this patent is extended or adjusted under 35 U.S.C. 154(b) by 65 days.

(21) Appl. No.: 11/851,990

(22) Filed: Sep. 7, 2007

(65) Prior Publication Data

US 2009/0065915 A1    Mar. 12, 2009

(51) Int. Cl.
  *H01L 23/495*    (2006.01)
  *H01L 21/98*    (2006.01)
(52) U.S. Cl. ..................................... 257/676
(58) Field of Classification Search .......... 257/666–677, 257/E23.031–E23.059, E23.004, 100, 433, 257/434, 667, 787–796, E31.117–E31.118, 257/E51.02, E23.116–E23.14, 678–733; 438/111, 112, 123, 15, 25, 26, 51, 55, 64–67, 438/124, 126, 127
See application file for complete search history.

(56) References Cited

U.S. PATENT DOCUMENTS

| | | | |
|---|---|---|---|
| 6,608,366 B1 * | 8/2003 | Fogelson et al. | 257/666 |
| 6,723,585 B1 * | 4/2004 | Tu et al. | 438/123 |
| 6,773,961 B1 | 8/2004 | Lee et al. | |
| 6,917,097 B2 * | 7/2005 | Chow et al. | 257/666 |
| 7,125,747 B2 * | 10/2006 | Lee et al. | 438/112 |
| 7,183,630 B1 | 2/2007 | Fogelson et al. | |
| 7,205,658 B2 | 4/2007 | Lee et al. | |
| 2002/0017706 A1 * | 2/2002 | Sone | 257/676 |
| 2002/0153596 A1 * | 10/2002 | Tsubosaki et al. | 257/666 |
| 2003/0178707 A1 | 9/2003 | Abbott | |
| 2004/0140541 A1 * | 7/2004 | Shimanuki | 257/666 |
| 2004/0238923 A1 * | 12/2004 | Lee et al. | 257/670 |
| 2005/0012187 A1 * | 1/2005 | Kameyama et al. | 257/676 |
| 2005/0116321 A1 * | 6/2005 | Li et al. | 257/666 |
| 2005/0121756 A1 * | 6/2005 | Chow et al. | 257/676 |
| 2005/0127494 A1 | 6/2005 | Liu | |
| 2005/0139972 A1 * | 6/2005 | Chiu et al. | 257/678 |
| 2005/0173793 A1 * | 8/2005 | Rohrmoser et al. | 257/724 |
| 2005/0194667 A1 * | 9/2005 | Huang et al. | 257/666 |
| 2005/0199987 A1 * | 9/2005 | Danno et al. | 257/672 |
| 2005/0255634 A1 * | 11/2005 | Yilmaz et al. | 438/113 |
| 2005/0287709 A1 * | 12/2005 | Lee et al. | 438/122 |
| 2006/0097366 A1 * | 5/2006 | Sirinorakul et al. | 257/666 |
| 2006/0199308 A1 * | 9/2006 | Lee et al. | 438/110 |
| 2007/0052070 A1 * | 3/2007 | Islam et al. | 257/666 |
| 2007/0087649 A1 * | 4/2007 | Murakami et al. | 445/46 |
| 2007/0176267 A1 * | 8/2007 | Abbott | 257/666 |
| 2007/0262426 A1 * | 11/2007 | Mahler | 257/669 |
| 2007/0273017 A1 * | 11/2007 | Maloney et al. | 257/690 |

* cited by examiner

*Primary Examiner* — Dao H Nguyen
*Assistant Examiner* — Tram H Nguyen
(74) *Attorney, Agent, or Firm* — Dicke, Billig & Czaja, P.L.L.C.

(57) ABSTRACT

A semiconductor device includes a singulated semiconductor package having a leadframe, a chip electrically coupled to the leadframe, encapsulating material covering the chip and a portion of the leadframe, and a material layer disposed over opposing ends of the leadframe. The leadframe includes a first face and an opposing second face, the first and second faces extending between opposing ends of the leadframe, where the second face configured to electrically couple with a circuit board. The chip is electrically coupled to the first face. The encapsulating material covers the chip and the first face of the leadframe. The material layer is configured to improve solderability of the singulated semiconductor package to the circuit board.

17 Claims, 6 Drawing Sheets

SINGULATED SEMICONDUCTOR PACKAGE

BACKGROUND

Integrated circuit chips are conventionally enclosed in a package that provides protection from environmental conditions and enables electrical interconnection between the chip and another electrical component, such as a printed circuit board or a motherboard. A semiconductor package includes a supporting leadframe, a chip electrically coupled to the leadframe, and encapsulating material molded over a surface of the leadframe and the chip. The encapsulating material thus defines an upper exterior surface of the package, while a second non-encapsulated surface of the leadframe defines a lower exterior surface of the package that is configured to be coupled to a printed circuit board.

The leadframe provides a support structure for the package. Quad Flat No Lead (QFN) and Dual Flat No Lead (DFN) are leadless packages where the leadframe is internal to the package and encased by the encapsulating material. When the package is singulated, or severed from its carrier, ends of the leadframe are exposed. Ultimately, a face of the package is attached to a printed circuit board or a motherboard with solder, for example. In some cases, the solder does not bond well to the exposed leadframe ends of the singulated package and fails to form an acceptable fillet of solder along edges of the package. Unacceptable fillets, or imperfect fillets, are associated with unacceptable or imperfect electrical connection between the package (and ultimately the chip) and the printed circuit board or the motherboard.

For these and other reasons there is a need for the present invention.

SUMMARY

One aspect provides a semiconductor device including a singulated semiconductor package having a leadframe, a chip electrically coupled to the leadframe, encapsulating material covering the chip and a portion of the leadframe, and a material layer disposed over opposing ends of the leadframe. The leadframe includes a first face and an opposing second face, the first and second faces extending between opposing ends of the leadframe, where the second face configured to electrically couple with a circuit board. The chip is electrically coupled to the first face. The encapsulating material covers the chip and the first face of the leadframe. The material layer is configured to improve solderability of the singulated semiconductor package to the circuit board.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

A singulated leadless semiconductor package is provided that is configured to have improved solderability to circuit boards and/or motherboards. Embodiments described below provide a singulated semiconductor quad flat no-lead (QFN) or a dual flat no-lead (DFN) package separated from its processing frame that is configured for attachment to a printed circuit board and includes a plating material disposed over pre-singulated ends of a leadframe and a second face of the leadframe. In one embodiment, the plating material is disposed over ends of the leadframe along sides of the package and along at least the bottom surface of the package, where the plating material is configured to have an infinity for solder, such as tin solder or alloys of tin solder. One embodiment provides a singulated semiconductor package including plating material disposed on sides of the package that preferentially wets with the solder to improve solderability of the package to the circuit board. The improved solderability is characterized by fillets of solder that uniformly attach along side edges of the package.

Figure 1:
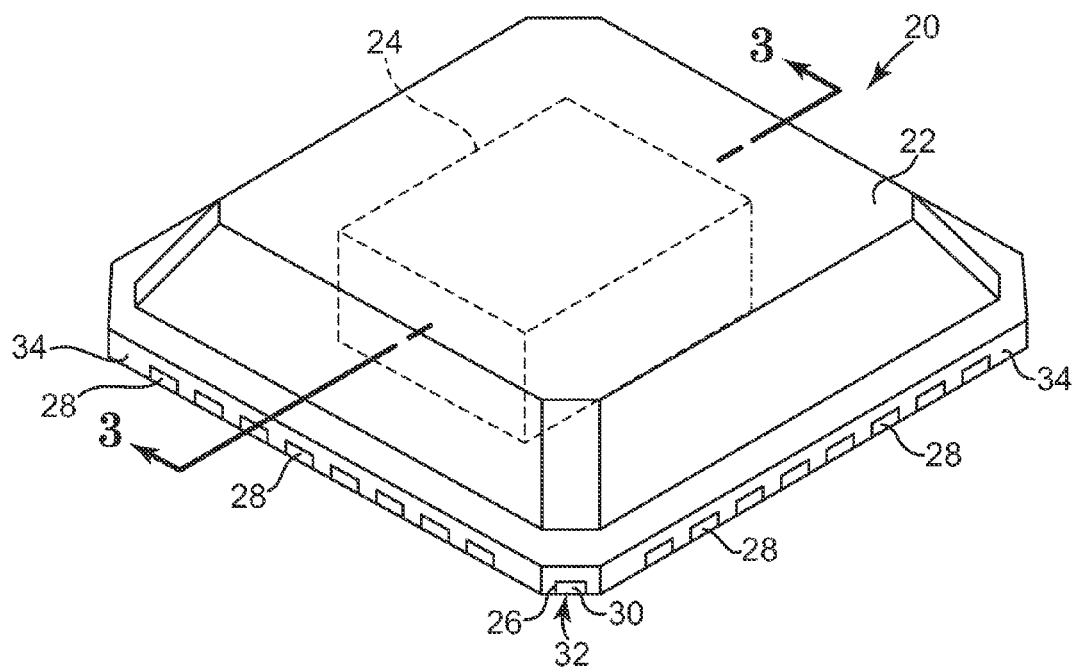
FIG. 1 is a perspective view of a singulated semiconductor package device according to one embodiment.

FIG. 1 is a perspective view of a singulated semiconductor package device 20 according to one embodiment. Singulated semiconductor package device 20 (package 20) includes an encapsulating material 22 covering a chip 24 that is electrically coupled to a leadframe 26, and plating material 28 disposed over a portion of sides 34. In one embodiment, plating material 28 is disposed over pre-singulated ends (90, 92, 94, 96 of FIG. 4) and a bottom surface (42 of FIG. 2) of leadframe 26. Package 20 as illustrated is singulated (i.e., fully separated from a carrying substrate) along an end 30 of a tiebar 32. In one embodiment, end 30 of tiebar 32 has been severed and is not covered by plating material 28.

The singulated package 20 is characterized by only a small surface area at the end 30 of tiebar 32 not being covered by plating material 28. Sides 34 of package 20 include a portion of encapsulating material 22 and plating material 28 covering leads (not visible) of leadframe 26. Leadframe 26 is thus substantially covered by encapsulating material 22 and/or plating material 28 and is protected from undesirable oxidative reactions that potentially form on exposed portions of leadframe 26. Plating material 28 is selected and configured to minimize such oxidation and to improve the solderability of package 20 to other electronic components, such as circuit boards.

Figure 2:
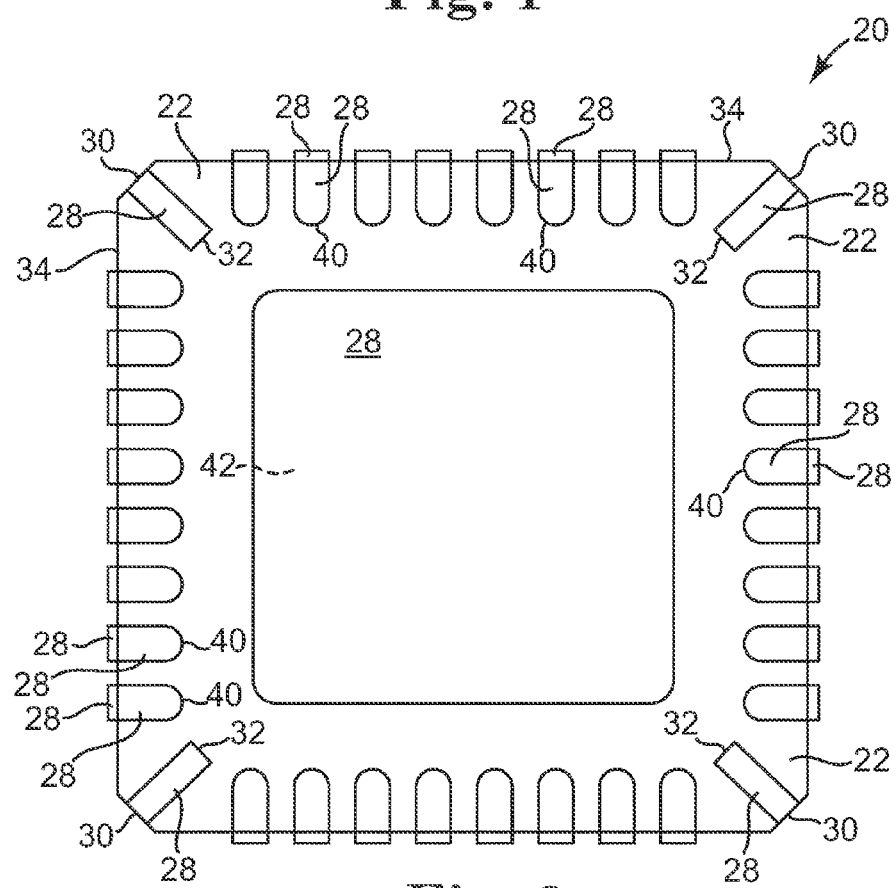
FIG. 2 is a bottom view of the singulated semiconductor package device shown in FIG. 1.

FIG. 2 is a bottom view of package 20. Encapsulating material 22 and plating material 28 combine to encapsulate (i.e., cover) substantially an entirety of leadframe 26 (FIG. 1). In the view of FIG. 2, leadframe 26 is encased by encapsulating material 22 and plating material 28. The major surfaces of the tiebars 32 and an entirety of leads 40 and face 42 are covered by plating material 28 (and not visible), but tiebars 32, leads 40, and face 42 are outlined in the bottom view of FIG. 2 to clarify their relationship to leadframe 26. In one embodiment, leadframe 26 includes tiebars 32, leads 40, and a face 42 that each has exterior portions covered by plating material 28. Tiebars 32 are provided to support and carry leadframe 26 through processing described in FIG. 4. Leads 40 provide input/output terminals suited for electrical connection to chip 24 (FIG. 1). In one embodiment, between about 4 to 156 leads are provided, depending upon whether leadframe 26 is a QFN of DFN leadframe. Face 42 provides a bonding surface suited for attachment of package 20 to circuit and mother boards. In one embodiment, at least the outer portions of leads 40 and face 42 are plated by plating material 28, and thus protected from oxidation and configured for improved solderability and improved electrical connection to other electrical devices.

Figure 3:
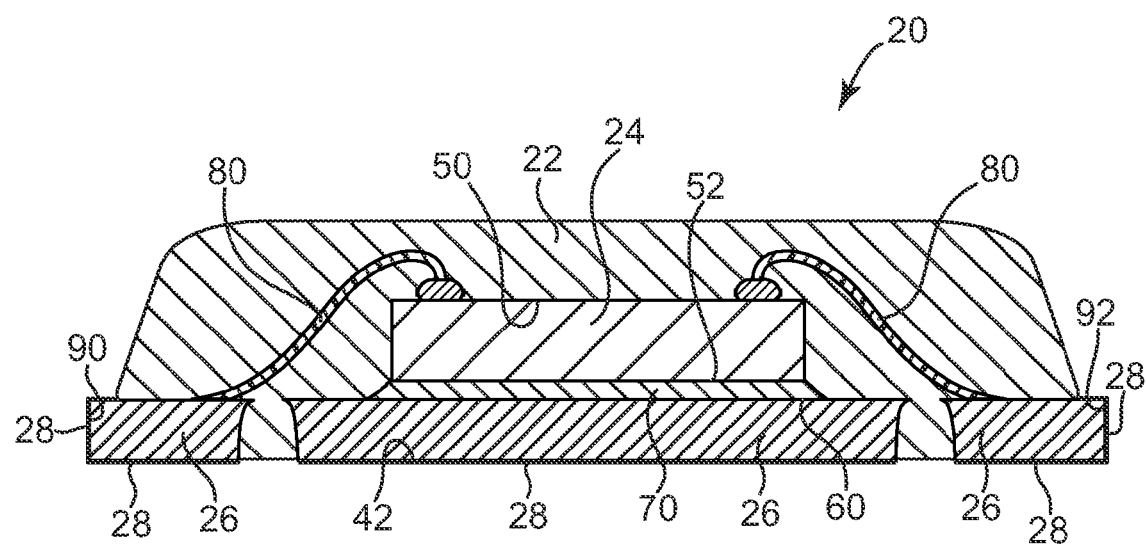
FIG. 3 is a cross-sectional view of the singulated semiconductor package device taken along the line 3-3 of FIG. 1.

FIG. 3 is a cross-sectional view of singulated semiconductor package device 20 taken along the line 3-3 of FIG. 1. In one embodiment, chip 24 includes an active surface 50 and a second surface 52 opposite active surface 50; leadframe 26 includes a first face 60 opposite second face 42; and package 20 includes a die attach material 70 coupled between second surface 52 of chip 24 and second face 60 of leadframe 26. In one embodiment, active surface 50 of chip 24 is electrically coupled to leadframe 26 by one or more wires 80.

In one embodiment, chip 24 is coupled to leadframe 26 in a die attach process employing die attach material 70, and wires 80 are coupled between chip 24 and leadframe 26 in a wire bonding process as known in the art. In one embodiment, die attach material 70 is an electrically conductive adhesive that connects chip 24 to first face 60 of leadframe 26. In one embodiment, die attachment material is a double-sided electrically conductive adhesive tape, although other suitable adhesives and forms of adhesives are also acceptable. In one embodiment, die attach material 70 is an electrically isolating adhesive that connects chip 24 to first face 60 of leadframe 26. In one embodiment, wires 80 include gold wires, silver wires, platinum wires, copper wires, or other suitable wires configured to electrically connect active surface 50 of chip 24 to leadframe 26.

In one embodiment, after package 20 is fabricated and singulated, encapsulating material 22 covers chip 24, first face 60 of leadframe 26, and wires 80, and plating material 28 covers at least opposing ends 90, 92 of leadframe 26 and face 42. Plating material 28 minimizes or eliminates oxidation of leadframe 26, and is selected to preferentially wet or bond with solder that is employed in attaching package 20 to circuit boards and other devices, thus improving solderability of package 20 to circuit boards.

In one embodiment, encapsulating material 22 includes epoxy, crosslinking polymer, crosslinked polymer, resin such as a moldable resin, or other electrically insulating material suited for molding and/or encapsulating chip 24 (FIG. 1). Chip 24 includes semiconductor chips in general and can include any chip suitable for use in a semiconductor package, such as logic chips, power chips, metal oxide semiconductor field effect transistor chips and the like. Leadframe 26 provides a support structure for package 20 and includes leadframes formed of metal such as copper, aluminum, alloys of copper, alloys of aluminum, or other suitable electrically conducting metals. In one embodiment, leadframe 26 includes a QFN leadframe having leads 40 on four sides. In another embodiment, leadframe 26 includes a DFN leadframe having leads 40 on two opposing sides. Plating material 28 is configured to improve solderability of singulated semiconductor package device 20 to a printed circuit board or motherboard. In one embodiment, plating material 28 includes tin, layers and/or coatings of tin, alloys of tin, metal alloys in general, or metals having an infinity for tin solder or tin-based solder. In one embodiment, plating material 28 is deposited in a chemical plating deposition process at a thickness in the range of between about 100 nanometers to 100 micrometers, and preferably plating material 28 is deposited at a thickness in the range of about 10 micrometers.

With additional reference to FIG. 3, in one embodiment package 20 includes an epoxy encapsulating material 22 covering a semiconductor chip 24 that is electrically coupled to a copper leadframe 26, and a tin plating material 28 is deposited in a chemical plating process over pre-singulated ends and a bottom surface of leadframe 26. To this end, plating material 28 is configured to be preferentially wet by tin solder, which results in a high quality fillet/electrical connection between the tin solder and the plating material 28.

Figure 4:
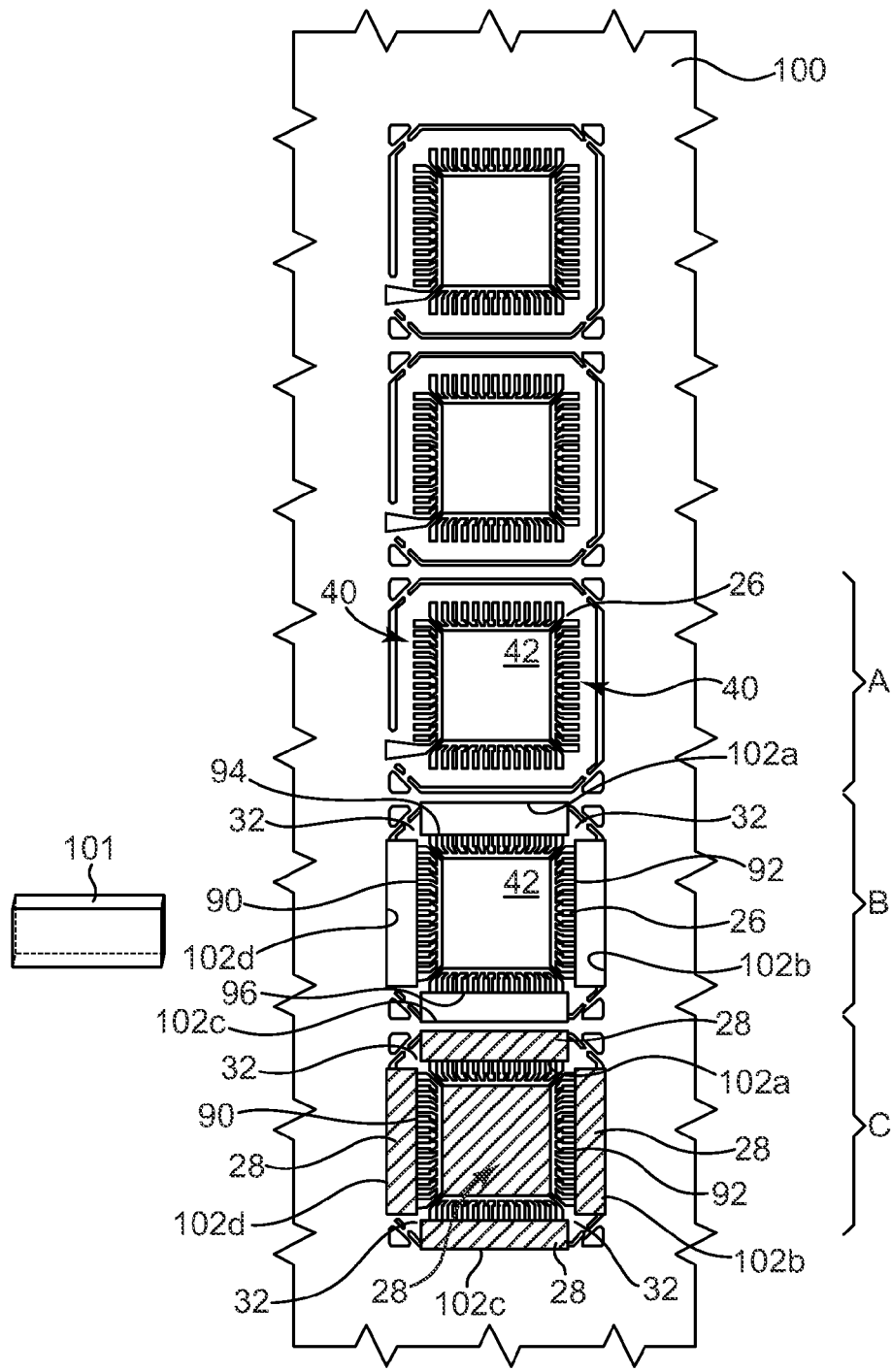
FIG. 4 is a bottom view of a frame undergoing a semiconductor package fabrication process where the frame includes multiple leadframes according to one embodiment.

FIG. 4 is a bottom view of a frame 100 undergoing a semiconductor package fabrication process according to one embodiment. In one embodiment, an opposing face of frame 100 (not shown in FIG. 4) includes a top side of frame 100 having a die attached to a pad of frame 100, where the die and the top side is covered by molding compound. In one embodiment, frame 100 includes a frame sheet or strip having a plurality of leadframes 26 disposed in an array having columns of leadframes 26 and rows of leadframes 26. In one embodiment, frame 100 includes multiple leadframes 26 disposed on a coiled frame 100. In another embodiment, frame 100 includes a single leadframe 26 configured for fabrication into a semiconductor package device 20.

In one embodiment, frame 100 includes a segment A having leadframe 26 that is ready for processing and that has not yet been singulated, a segment B having a leadframe 26 that has been pre-singulated, and a segment C including a leadframe 26 that has been pre-singulated and plated and is coupled to frame 100 by tiebars 32.

Segment A of frame 100 includes leadframe 26 having a plurality of leads 40 (or lands) that are etched/printed/stamped on a perimeter of leadframe 26, and face 42 that is oriented up relative to the view of FIG. 4. Face 60 (FIG. 3) of leadframe 26 and die 24 of package 20 are disposed on a side opposite of face 42 (i.e., underneath frame 100) and are not visible in FIG. 4.

Segment B of frame 100 includes a pre-singulated leadframe 26 that is coupled to frame 100 by tiebars 32. In one embodiment, a punch 101 or cutting tool 101 is employed to remove portions 102 of frame 100 along sides of leadframes 26, thus severing or singluating leads/lands 40. Removal of portions 102 of frame 100 severs leads/lands 40 and exposes opposing ends 90, 92 of leadframe 26. In one embodiment, the opposing ends of leadframe 26 include opposing lateral ends 90, 92 and opposing longitudinal ends 94, 96. The removed portions 102 of frame 100 define slots 102a, 102b, 102c, and 102d extending between a pair of tiebars 32 of leadframe 26.

Segment C of frame 100 illustrates plating material 28 plated over face 42 and onto the surfaces of slots 102a-102d. Plating material 28 covers/coats slots 102a-102d, face 42, leads 40, the severed leads/lands 40, the opposing lateral ends 90, 92, and the opposing longitudinal ends 94, 96 of leadframe 26. In one embodiment, a cutting tool is subsequently employed to sever tiebars 32 and singulate package 20 from frame 100, such that package 20 is provided in its free standing form as best illustrated in FIG. 1.

Figure 5:
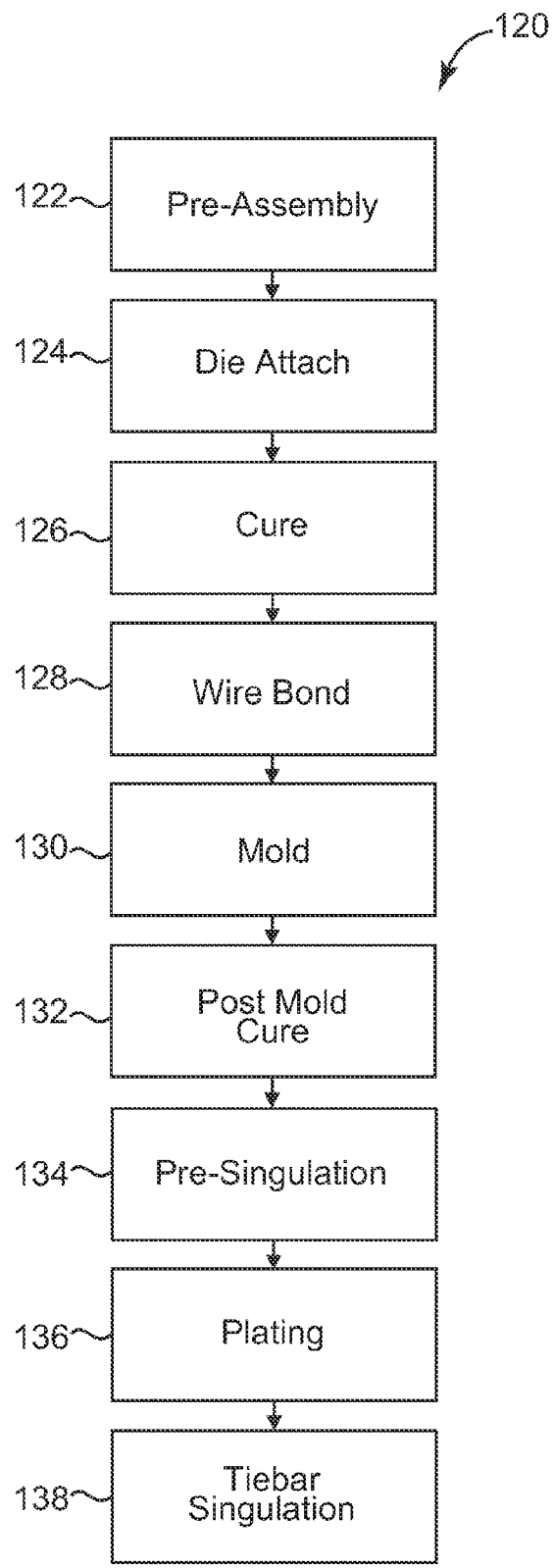
FIG. 5 is a fabrication flowchart for processing singulated semiconductor package devices according to one embodiment.

FIG. 5 is a fabrication flowchart 120 related to the processing of singulated semiconductor package devices 20 according to one embodiment. With additional reference to FIG. 3, one embodiment of fabricating package 20 includes pre-assembly 122 in which leadframe 26 is prepared and/or primed for the attachment of chip 24 to face 60. In one embodiment, fabrication of package 20 includes a die attach process 124 in which second surface 52 of chip 24 is coupled to first face 60 of leadframe 26 by adhesive 70. In one embodiment, fabrication of package 20 includes a cure process 126 in which leadframe 26/chip 24/adhesive 70 are cured to ensure a suitable level of electrical communication between chip 24 and leadframe 26.

In one embodiment, fabrication of package 20 includes a wire bond process 128 in which wires 80 are electrically connected between active surface 50 of chip 24 and leadframe 26. In one embodiment, wires 80 are wire bonded to leadframe 26 and wire bonded to a pad provided on active surface 50 of chip 24. In one embodiment, fabrication of package 20 includes a mold process 130 in which encapsulating material 22 is molded over chip 24, wires 80, and first face 60 of leadframe 26. Encapsulating material 22 includes molding compound or epoxy or polymer that is suitably molded in place over chip 24, wires 80, and a portion of the leadframe 26. In one embodiment, fabrication of package 20 includes a post mold cure process 132 in which encapsulating material 22 is cured to define a durable, stable exterior for package 120.

In one embodiment, fabrication of package 20 includes a pre-singulation process 134 in which a punch 101 or cutting tool 101 (FIG. 4) is employed to sever or cut or remove portions 102 of frame 100 (FIG. 4) adjacent to ends 90, 92, 94, 96 of leadframe 26. In one embodiment, fabrication of package 20 includes a plating process 136 in which plating material 28 is deposited over leads 40, face 42, and pre-singulated ends 90, 92, 94, 96 of leadframe 26. In one embodiment, plating material 28 includes tin that is chemically plated into slots 102a-102d, over leads 40 and onto face 42 of leadframe 26 as best illustrated in FIG. 4. Ultimately, fabrication of package 20 includes a tiebar singulation process 138 in which tiebars 32 (FIG. 4) are severed or cut to singulate and remove package 20 from frame 100.

Figure 6:
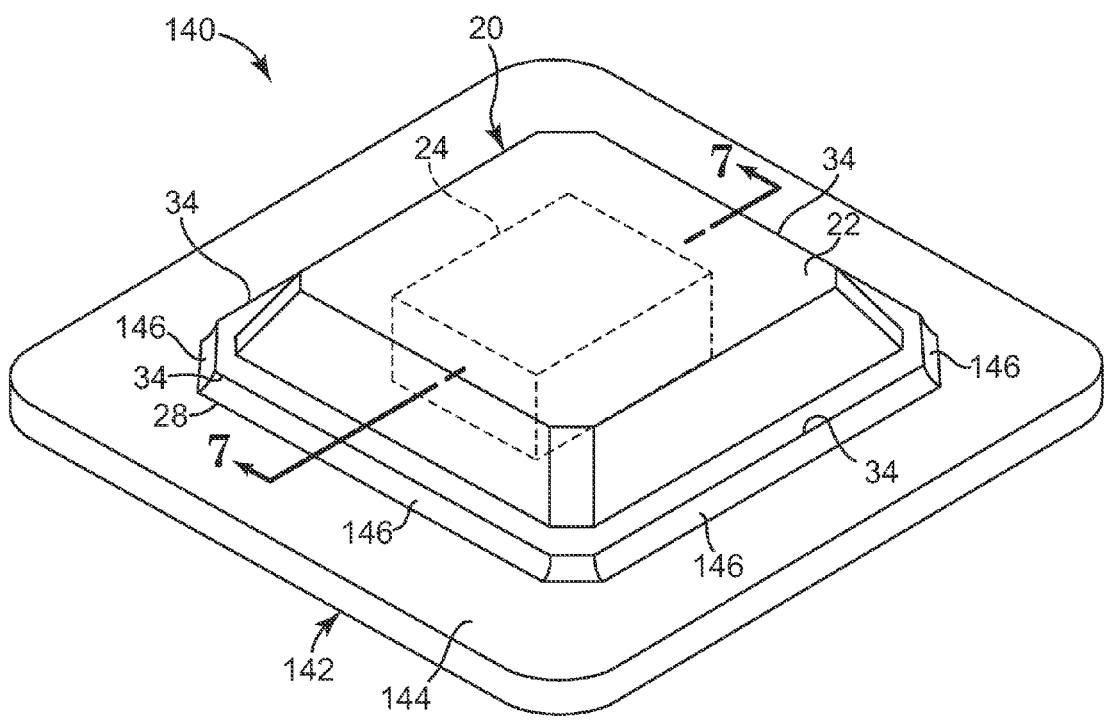
FIG. 6 is a perspective view of a semiconductor assembly including a singulated semiconductor package device attached to a printed circuit board according to one embodiment.

FIG. 6 is a perspective view of a semiconductor assembly 140 according to one embodiment. Semiconductor assembly 140 includes singulated semiconductor package device 20 coupled to a printed circuit board 142. In one embodiment, package 20 is soldered onto a surface 144 of printed circuit board 142 by fillets 146 of solder, where the fillets 146 of solder are uniformly disposed along sides 34 of package 20 and electrically couple face 42 (FIG. 2) of package 20 to printed circuit board 142.

Figure 7:
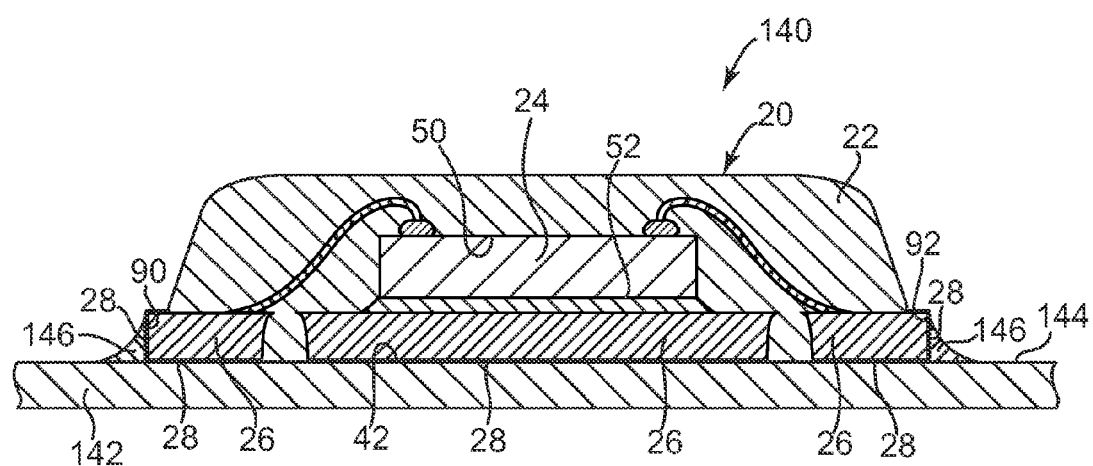
FIG. 7 is a cross-sectional view of the semiconductor assembly of FIG. 6 illustrating a fillet of solder wetted to edges of the singulated semiconductor package device.

FIG. 7 is a cross-sectional view of semiconductor assembly 140 taken along line 7-7 of FIG. 6. Package 20 includes plating material 28 that is selected to preferentially bond with fillets 146 of solder. In one embodiment, plating material 28 includes tin solder that wets the bottom of package 20, coupling package 20 to printed circuit board 142, and forms fillets of solder 146 on opposing ends 90, 92 of package 20. In one embodiment, the tin solder 28 preferentially wets/bonds with opposing ends 90, 92 of package 20 to form tin solder fillets 146.

In general, the cross-sectional shape of fillets 146 is determined in part by the surface tension of the solder employed to form fillets 146. Fillets 146 preferentially wet plating material 28 and uniformly cover plated ends 90, 92, 94, 96 of leadframe 26. In one embodiment, improved electrical connection between package 20 and circuit board 142 is provided by fillets 146 that bond with substantially an entirety of plated ends 90, 92, 94, 96 of package 20. In one embodiment, plating material 28 defines a bonding layer, and the fillets 146 of solder extend over an entirety of a height of the bonding layer as illustrated in FIG. 7.

A pre-singulated semiconductor package device is provided that has improved solderability to printed circuit boards. The improved solderability enables improved electrical connection between the semiconductor package and the printed circuit board. The singulated package includes plating material deposited over ends of the leadframe such that the ends of the leadframe are prevented from undesirably oxidizing during fabrication of the semiconductor and/or the semiconductor assembly. In addition to minimizing oxidation of the leadframe, the plating material is selected to have an infinity for solder used to couple the package to the printed circuit board. In this manner, the fillets of solder formed between the package and the printed circuit board provide improved electrical connection for the device and the assembly.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific singulated semiconductor package embodiments discussed herein. Therefore, it is intended that this invention be limited only by the claims and the equivalents thereof.

What is claimed is:
1. A semiconductor device comprising:
a singulated semiconductor package including:
a leadframe comprising at least one severed tiebar, a first face and an opposing second face parallel to the first face, the first and second faces extending between opposing pre-singulated ends of the leadframe, the second face configured to electrically couple with a circuit board;
a chip electrically coupled to the first face;
encapsulating material covering the chip and the first face of the leadframe; and
a material layer disposed over the opposing pre-singulated ends of the leadframe from the first face to the second face, the material layer configured to improve solderability of the singulated semiconductor package to the circuit board, wherein the material layer is not disposed over exposed severed edges of the at least one tiebar, the exposed severed edges extending completely from the first face to the second face parallel to the first face.

2. The semiconductor device of claim 1, wherein the package comprises a leadless package and the opposing pre-singulated ends of the leadframe comprise opposing lateral ends of the leadless package and opposing longitudinal ends of the leadless package, and the material layer comprises a metal layer plated on the opposing lateral ends and the opposing longitudinal ends of the leadless package.

3. The semiconductor device of claim 2, wherein the leadframe comprises copper and the metal layer plated on the opposing lateral ends and the opposing longitudinal ends of the leadless package comprises a plating configured to improve solderability of the singulated semiconductor package to the circuit board.

4. The semiconductor device of claim 2, wherein the material layer comprises tin plated on the second face and the opposing lateral and longitudinal ends of the leadframe.

5. A semiconductor device comprising:
a singulated semiconductor package configured for electrical connection to a circuit board, the singulated semiconductor package including:
a leadframe comprising at least one severed tiebar, a first face and an opposing second face parallel to the first face, the first and second faces extending between opposing pre-singulated ends of the leadframe, the second face configured to electrically couple with the circuit board;
a chip electrically coupled to the first face and a material encapsulating the chip and the first face of the leadframe; and
means for plating the opposing pre-singulated ends of the leadframe from the first face to the second face,
wherein the means for plating is not disposed over exposed severed edges of the at least one tiebar, the exposed severed edges extending completely from the first face to the second face parallel to the first face.

6. The semiconductor device of claim 5, wherein the means for plating the opposing pre-singulated ends of the leadframe comprise means for improving solderability of the singulated semiconductor package to the circuit board.

7. The semiconductor device of claim 6, wherein the means for improving solderability of the singulated semiconductor package to the circuit board comprises a tin plating in contact with the opposing pre-singulated ends of the leadframe.

8. The semiconductor device of claim 5, wherein the leadframe comprises copper and the means for plating the opposing pre-singulated ends of the leadframe comprises means for plating the second face of the leadframe.

9. The semiconductor device of claim 8, wherein the means for plating the opposing pre-singulated ends of the leadframe and the second face of the leadframe comprises chemically plating a layer of tin onto exposed portions of the singulated copper leadframe.

10. A semiconductor device comprising:
a singulated semiconductor package having a bottom and opposing sides and including:
a leadframe comprising at least one severed tiebar, a first face, an opposing second face parallel to the first face, first leads with first pre-singulated ends on one of the opposing sides, and second leads with second pre-singulated ends on the other one of the opposing sides, the first and second faces extending between the first pre-singulated ends and the second pre-singulated ends, and the second face configured to electrically couple with a circuit board;
a chip electrically coupled to the first face;
encapsulating material covering the chip and the first face of the leadframe; and
a material layer disposed on the opposing sides of the singulated semiconductor package from the first face to the second face, over the first pre-singulated ends and the second pre-singulated ends on the opposing sides of the singulated semiconductor package,
wherein the material layer is not disposed over exposed severed edges of the at least one tiebar, the exposed severed edges extending completely from the first face to the second face parallel to the first face.

11. The semiconductor device of claim 10, wherein the singulated semiconductor package comprises a leadless package and the first and second pre-singulated ends are opposing lateral ends of the leadless package, and the material layer comprises a metal layer plated on the opposing lateral ends of the leadless package.

12. The semiconductor device of claim 1, further comprising:
an electrically conductive adhesive material connecting the chip to the first face of the leadframe.

13. The semiconductor device of claim 12, wherein the electrically conductive adhesive material comprises a double-sided electrically conductive adhesive tape.

14. The semiconductor device of claim 5, further comprising:
an electrically conductive adhesive material connecting the chip to the first face of the leadframe.

15. The semiconductor device of claim 14, wherein the electrically conductive adhesive material comprises a double-sided electrically conductive adhesive tape.

16. The semiconductor device of claim 10, further comprising:
an electrically conductive adhesive material connecting the chip to the first face of the leadframe.

17. The semiconductor device of claim 16, wherein the electrically conductive adhesive material comprises a double-sided electrically conductive adhesive tape.

* * * * *